United States Patent [19]
Sechi

[11] 3,991,381
[45] Nov. 9, 1976

[54] LINEAR HIGH POWER TRANSISTOR AMPLIFIER

[75] Inventor: Franco Nicola Sechi, Lawrenceville, N.J.

[73] Assignee: RCA Corporation, New York, N.Y.

[22] Filed: June 30, 1975

[21] Appl. No.: 591,954

[30] Foreign Application Priority Data
Feb. 10, 1975 United Kingdom............... 5495/75

[52] U.S. Cl. .................................. 330/35; 330/40
[51] Int. Cl.² .......................................... H03F 3/16
[58] Field of Search ............... 330/22, 18, 35, 40; 325/185, 492

[56] References Cited
UNITED STATES PATENTS

| | | | |
|---|---|---|---|
| 3,374,442 | 3/1968 | Griffin | 330/40 |
| 3,443,241 | 5/1969 | Pitzalis | 330/29 |
| 3,501,710 | 3/1970 | Liepins et al. | 330/40 X |
| 3,708,756 | 1/1973 | Fajen | 330/40 X |
| 3,714,601 | 1/1973 | Minton et al. | 330/40 X |
| 3,801,922 | 4/1974 | Muszkiewicz | 330/40 X |

*Primary Examiner*—James B. Mullins
*Attorney, Agent, or Firm*—Edward J. Norton; Joseph D. Lazar; Michael A. Lechter

[57] ABSTRACT

A linear high power transistor amplifier operable over a wide band of modulation frequencies wherein linearity of response is maintained by use of an active bias circuit.

12 Claims, 4 Drawing Figures

LINEAR HIGH POWER TRANSISTOR AMPLIFIER

BACKGROUND OF THE INVENTION

1. Field of the Invention

The present invention is directed to class B linear-frequency response amplifiers.

2. Description of the Prior Art

Linear high-power amplifiers are required in a number of telecommunication applications. In particular, linear high power amplifiers are required in telecommunication systems operating with multiple carrier frequencies within a single radio frequency (RF) channel. Linear amplifiers are required in such systems to avoid generation of spurious signals (termed intermodulation), arising due to non-linearities in the response of the amplifier at a given carrier frequency. Such spurious signals interfere with the signals on the other carrier frequencies. Typically, such systems operate a microwave carrier frequencies in the 1–5 GHz range with 40 MH$_z$ RF channels. The ratio of the modulation frequency (carrier separation) to the carrier frequency is thus in the order of 1–2%. Such systems typically require that the amplifier have a carrier to intermodulation amplitude ratio of 20 to 30 db.

Satellite telecommunication systems have typically utilized traveling wave tube (TWT) amplifiers. However, where high carrier to intermodulation ratios are required, the efficiency of the TWT is low. A typical value of TWT efficiency for a carrier to intermodulation amplitude ratio of 30 db is in the order of 3%.

Attempts to replace TWT amplifiers with transistor amplifiers have historically failed because the efficiency of class A transistor amplifiers is unacceptably low while the modulation bandwidth of high efficiency class B or class AB transistor amplifiers have typically not been broad enough to encompass a large enough spectrum of frequencies in the RF channels, as compared to the bandwidth of TWT amplifiers. A prior art class B (or AB) transistor amplifier circuit is depicted in FIG. 1. An amplitude modulated signal is supplied by a suitable RF source 10 to the emitter 12 of an npn transistor 14, operating in the class B (or AB) mode, through a suitable transmission line 16 and DC blocking capacitor 18. Transistor 14 may be, as known in the art, either of the npn or pnp type transistor, or a field effect transistor (FET). An amplified RF signal is supplied to a load 20 from the collector 22 of transistor 14 through a suitable transmission line 24 and DC blocking capacitor 26. The base of transistor 14 is connected to ground. Such a configuration is known in the art as a common base amplifier. Collector and emitter biasing are respectively supplied by circuits generally indicated as 32 and 34. Collector biasing circuit 32 supplies to the collector 22 of transistor 14 a positive voltage with respect to ground from voltage source Vcc. An RF choke 36 and bypass capacitor 38 are provided to isolate battery Vcc from the RF signal. Emitter bias circuit 34 supplies to emitter 12 of transistor 14 a negative voltage with respect to ground from voltage source Vee. An RF choke (inductor) 40 and capacitors 42 and 44 are provided to isolate the voltage source from the RF and the modulation signal, as will be explained.

In order to operate the RF circuit in the class B mode, particular bias conditions must be provided between the emitter and ground. In addition, to maintain linearity of response, the impedance of the emitter base circuitry of transistor 14 must be maintained constant at a particular precalculated value. To accomplish this, a predetermined value of resistance, generally indicated in the art as linearization resistor 46, is inserted in the circuit between the emitter and ground. The value chosen for linearization resistor 46 is based on tradeoffs of competing design criteria. On one hand the linearization resistance must be greater than the internal emitter-base resistance of transistor 14 and greater than the reactance of inductor 40 over the range of modulation frequencies, to thereby "mask" any non-linearities and frequency related variations therein. On the other hand, the linearization resistance must be small enough so that it does not substantially reduce the gain of the amplifier. The ohmic value of the linearization resistor 46 is typically in the order of 1 ohm. Further, inductor 40 must present a negligible reactance for the entire range of modulation frequencies.

Inductor 40 embodies an inherent limitation on the range of frequencies for which the amplifier maintains a linear response. The value of inductor 40 must be such as to choke off the RF carrier signal (1–5 GHz). However, the response of the amplifier becomes non-linear with respect to those modulation frequencies high enough to cause the reactance of inductor 40 to become an appreciable factor in the impedance of the emitter-base circuit. The response of the amplifier typically becomes non-linear when the reactance of inductor 40 becomes equal to the linearization resistor 46.

In addition to maintain the impedance of the emitter-base circuitry over the entire range of modulation frequencies, the voltage sorce Vee must present an essentially resistive impedance which is negligible over the entire bandwidth with respect to the value of the total impedance of linearization resistor 46, inductor 40 and the emitter-base impedance of transistor 14. Such total impedance over the acceptable range of modulation frequencies is substantially equal to the value of linearization resistor 46. The above-mentioned common base amplifier, linearization resistor 46 and inductor 40 will hereinafter be generally referred to as amplifier 30. The prior art circuit of FIG. 1 serves to maintain a constant source impedance to a limited extent by providing a plurality of capacitors 42 and 44 across voltage source Vee in proximity to the linearization resistor 46. The values of the capacitances are chosen so that, for example, capacitor 42 operates to bypass high frequency modulation signals to ground and capacitor 44 operates to bypass low frequency modulation signals to ground. However, the bandwidth of the system with respect to the modulation signal is limited by the internal inductance of capacitor 44, generally indicated as 48. At high frequencies, the larger capacitor 44 becomes essentially inductive and a resonant circuit is formed in conjunction with smaller capacitor 42. Thus, at such resonant frequencies the impedance of the source is appreciable with respect to the value of linearization resistor 46 and the response of the amplifier becomes non-linear, causing high intermodulation distortion. Such a circuit operating at an RF carrier frequency of 4 GHz is typically linear only over the range of modulation frequencies from 0 to 3 MHz. Hence, such a circuit is not suitable as a broadband amplifier of type served by TWT amplifiers.

SUMMARY OF THE INVENTION

The present invention is directed to a class B or class AB linear amplifier for amplifying, with low intermodulation distortion, a radio frequency (RF) signal, where the RF signal is amplitude modulated with modulation signals having a wide range of frequencies. Such linear amplifiers typically include a class B or AB RF amplifier transistors having first, second and third electrodes, a linearization resistor means coupled to one of the electrodes, a first biasing circuit for providing a voltage across the first and second electrodes, and a second biasing circuit for providing a voltage across the first and third electrodes. The improvement of the present invention is characterized by at least one of the biasing circuits being an active circuit, including a voltage source and at least one active element. The biasing circuit provides a substantially constant low impedance to the RF amplifier transistor over a substantial portion of the range of modulation frequencies.

DETAILED DESCRIPTION OF A PREFERRED EMBODIMENT

Figure 1:
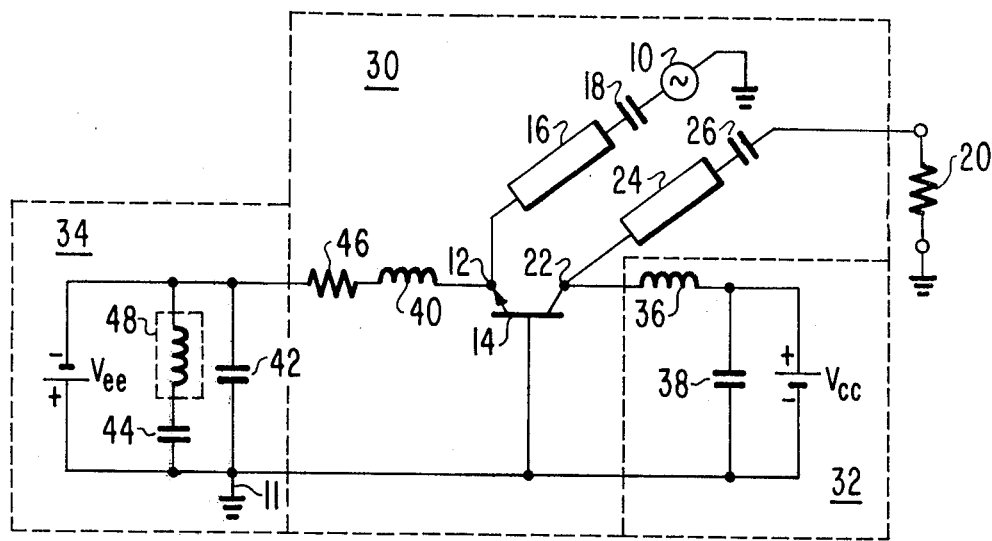
FIG. 1 is a schematic diagram of a linear amplifier in accordance with the prior art, described above.
Figure 2:
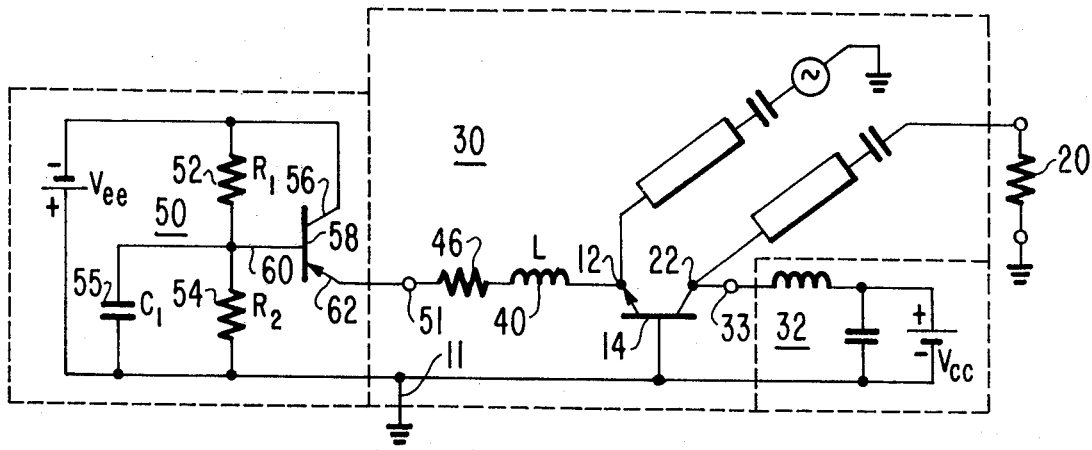
FIG. 2 is a schematic diagram of one embodiment of a broadband linear class B amplifier in accordance with the present invention.

With reference to FIG. 2, one embodiment of a linear, class B (or AB) amplifier in accordance with the present invention is described. An amplifier 30 is supplied with collector biasing by a collector bias circuit 32 at what may be termed the output port 33 of amplifier 30 and, in accordance with the present invention, is supplied with emitter biasing through linearization resistor 46 and RF choke 40 by an active emitter biasing circuit 50, applied at what may be termed the dc input port 51 of amplifier 30. Amplifier 30 and collector biasing circuit 32 are of the same type as those elements having the same numerals in FIG. 1, described earlier. The emitter biasing circuit 50 may be any active biasing circuit which operates to provide to amplifier 30 a substantially constant essentially resistive impedance, having a value small over a wide range of modulation frequencies as compared to what may be termed the amplifier input impedance, measured from dc input port 51 of amplifier 30 with respect to ground looking towards transistor 14. It is noted that such an amplifier input impedance is substantially equal to the value of linearization resistor 46 over the range of modulation frequencies. Specifically, in the embodiment shown in FIG. 2, an emitter bias voltage supply, Vee, is applied across a voltage divider network comprising serially connected resistors 52 and 54. A capacitor 55 may be connected in parallel with resistor 54, for frequency independence as will be explained. The collector 56 of a transistor 58, typically of complementary type to transistor 14, is connected to the negative terminal of voltage supply Vee. As will be hereinafter explained, transistor 58 may be in the alternative, of the same type transistor not complementary as transistor 14. The base 60 of transistor 58 is connected to the common connection between resistors 52 and 54. The emitter 62 of transistor 58 is connected to the dc input port 51 of amplifier 30. The positive terminal of voltage supply Vee is connected to ground. Such configuration, absent capacitor 55, is known in the art as an emitter follower.

As noted above and as will hereinafter be explained in more detail, the inductance value L of inductor 40 is chosen such that it presents a high impedance at the RF carrier frequency, to thus "choke" the RF carrier, but presents a relatively low impedance at the modulation frequencies. Thus, only the modulation signals (and d.c. biasing) are present in the emitter biasing circuit 50.

A known emitter follower (biasing circuit 50, absent capacitor 55) will supply a substantially constant output impedance for modulation frequencies less than the common-emitter cutoff frequency, $f_c$, of transistor 58.

The current gain $\beta$ of transistor 58 is expressed by the known relation:

$$\beta = \frac{\beta_o}{1 + j\frac{f}{f_c}} \quad (2)$$

where $\beta$ is current gain for all frequencies, $\beta_o$ is the DC current gain; $f$ is the modulation frequency and $f_c$ is the common emitter cut-off frequency.

The common-emitter cutoff frequency, $f_c$, is a parameter of transistor 58 defined as that frequency at which the current gain $\beta$ of transistor 58, connected in a common-emitter configuration, is equal to $1/\sqrt{2}$ times the d.c. current gain $\beta_o$, i.e., a reduction in gain of 3 db. A typical value of $f_c$ for an npn transistor is 60 MHz. The output impedance $Z_{out}$ of a known emitter follower circuit, as measured between emitter 62 and ground 11, is approximately the input impedance as measured between base 60 and ground 11 divided by $\beta$. For a more detailed description of this impedance, reference is made to Shilling and Belove, "Electronic Circuits: Discrete and Integrated", McGraw-Hill, 1968, Section 6.4. Again noting that capacitor 55 is not present in a typical emitter follower, the output impedance of a typical emitter follower may be thus expressed as:

$$Z_{out} = \frac{1}{\beta} \left( \frac{R_1 R_2}{R_1 + R_2} \right) \quad (3)$$

Substituting equation (2) for $\beta$ into equation (3) results in:

$$Z_{out} = \frac{1 + j\frac{f}{f_c}}{\beta_o} \left( \frac{R_1 R_2}{R_1 + R_2} \right) \quad (4)$$

It is seen that an appreciable phase shift and increase in magnitude occurs in $Z_{out}$ for modulation frequencies $f$ above the common-emitter cutoff frequency $f_c$. Thus, the known emitter follower is usually suitable as active bias network 50 for modulation frequencies below $f_c$.

The addition of capacitor 55 to the emitter follower arrangement operates to extend the frequency range, or to "broad-band", as often-times is stated in the art, the active bias circuit 50 by adjusting the input impedance, and thus the output impedance to compensate for frequency related changes in B. With capacitor 55 in the circuit, the output impedance of transistor 58 is approximated by the expression;

$$Z_{out} = \frac{1}{\beta_o} \left( \frac{R_1 R_2}{R_1 + R_2} \right) \left( \frac{1 + j \frac{f}{f_c}}{1 + j 2\pi f} \frac{R_1 R_2 C}{R_1 + R_2} \right) \quad (5)$$

The values C, $R_1$, and $R_2$ of capacitor 55, and resistors 52 and 54, respectively, are chosen such that the time constant $\tau$ of the circuit measured between base 60 and ground 11 may be expressed:

$$\tau = \frac{R_1 R_2 C}{R_1 + R_2} = \frac{1}{2\pi f_c} \quad (6)$$

The output impedance $Z_{out}$ may thus be expressed:

$$Z_{out} = \frac{1}{\beta_o} \frac{R_1 R_2}{R_1 + R_2} \left( \frac{1 + j \frac{f}{f_c}}{1 + j \frac{f}{fc}} \right) = \frac{1}{\beta_o} \left( \frac{R_1 R_2}{R_1 + R_2} \right) \quad (7)$$

The output impedance $Z_{out}$ of transistor 58 may thus be made substantially independent of the modulation frequency $f$.

It is noted, however, that equation (2) is only a good approximation of the gain $\beta$ of transistor 58 for frequencies up to approximately $\beta_o \pi f_c$. For further explanation of the principles involved, reference is made to Thornton, DeWitt, Grey and Chenette; "Characteristics and Limitations of Transistors", SEEC Vol. 4, p. 80, John Wiley & Sons, New York, 1966. Beyond the immediately above cited limitation, it is further noted that at higher frequencies though less than $\beta_o \pi f_c$ the voltage gain of the emitter follower reduces from substantial unity due to parasitic impedances in transistor 58. Moreover, at very high frequencies though still less than $\beta_o \pi f_c$, e.g., above 100 MHz, resistors 52 and 54, and capacitor 55 acquire substantial parasitic inductive components. In practice, with the present state of the art, such parasitics limit the frequency-independence of the output impedance to, for example, three times the common-emitter cutoff frequency (3 $f_c$).

As noted above, the value L of inductor 40 must be chosen such that it "chokes" the RF carrier signal but presents a low impedance at the modulation frequencies. Accordingly, the inductance value L is chosen to present a reactance approximately equal to the linearization resistance at the maximum modulation frequency, its resistance value being negligibly low. Thus, when the modulation frequency is within the range of operation, the bias circuit appears essentially resistive to the transistor 14.

By such an arrangement a linear amplifier having broad band capabilities, is provided according to the present invention.

Temperature compensation of the biasing circuit 50 can be effected by using temperature sensitive devices, such as two serially connected diodes made of the same material of the transistors, e.g., silicon to provide the resistance $R_2$ of resistor device 54, as well known in the art.

The circuit depicted in FIG. 2 may, as mentioned above, in the alternative utilize the same conductivity-type transistors for both transistors 14 and 50, as opposed to complementary transistors as shown in FIG. 2. For example, such a circuit has been implemented using RCA TA 8922 transistors for transistors 14 and 58. The circuit operated at a carrier frequency of 4 GHz, with a range of modulation frequencies from 0 to 10 MHz. An RCA TA 8922 transistor is a bipolar transistor (npn) having a characteristic common emitter cutoff (angular) frequency $\omega_c$ of 380 × 10⁶ rad/sec ($f_c$ = 60 MHz). The respective values of $R_1$, $R_2$ and $C_1$ used in were 46Ω, 20Ω, and 130pF. The value L of choke 40 was 4nH.

As is well known in the art, npn transistors require opposite polarity bias voltages across the emitter base and collector base junctions, as compared to a pnp transistor. Accordingly, in utilizing a npn, RCA TA 8922 transistor for transistor 58, the polarity of Vee is reversed, from that shown in FIG. 2, the emitter of the transistor 58 (connected to linearization resistor 46 in FIG. 2), is connected to ground and the juncture of resistor 54 and capacitor 55 (connected to ground in FIG. 2), is connected to linearization resistor 46.

It should be appreciated that the collector biasing circuit 32 may also be an active bias circuit similar to emitter biasing circuit 50, providing thereby a constant impedance having a value small as compared to the collector-base output impedance of transistor 14. Again, it should be appreciated that any active biasing circuit which operates to provide to transistor 14 a substantially constant if not a constant impedance of an appropriate value over a wide range of modulation frequencies may be used as the respective biasing circuits 32 and 50.

Figure 3:
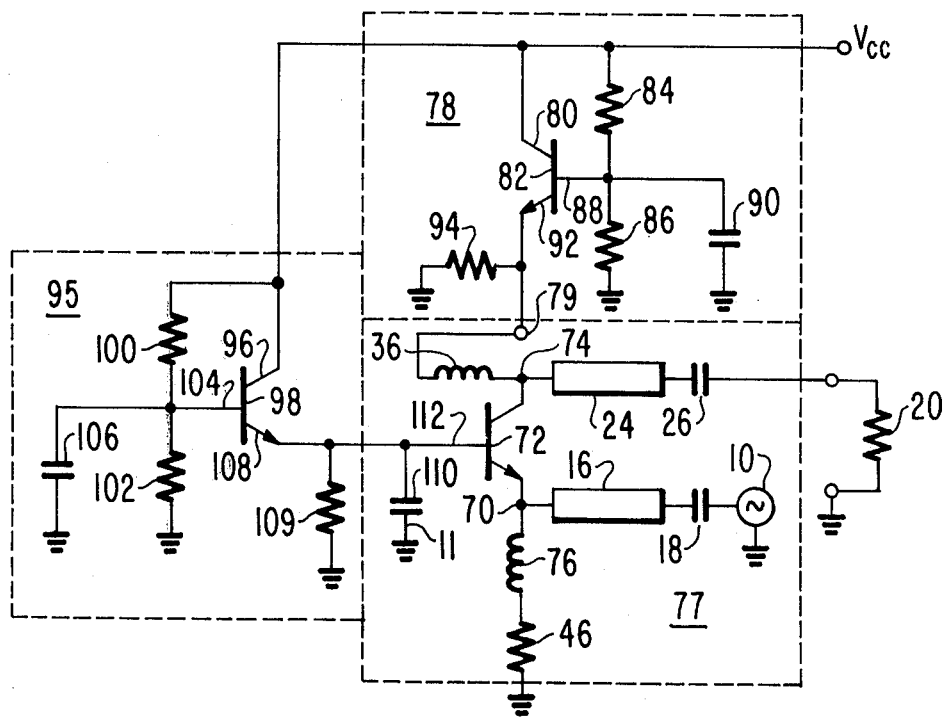
FIG. 3 is a schematic diagram of the preferred embodiment of a broadband linear class B amplifier in accordance with the present invention utilizing bipolar transistors.

FIG. 3 is a schematic of a second and preferred embodiment of a broad band linear class B amplifier in accordance with the present invention. An RF carrier, amplitude modulated signal is supplied by suitable RF source 10 to the emitter 70 of a transistor 72 and an amplified RF signal is generated by the amplifier and supplied to a load 20 from the collector 74 of transistor 72 through a transmission line 24 and d.c. blocking capacitor 26. Emitter 70 is connected to ground 11 through an RF choke 76 and linearization resistor 46. Such elements will hereinafter be generally referred to as amplifier 77. In accordance with the present invention, D.C. biasing is provided to what may be termed the D.C. output port 79 of amplifier 77, i.e., through RF choke 36 to collector 74 of transistor 72, by an active collector biasing circuit 78. Specifically, positive voltage source Vcc is applied to the collector 80 of transistor 82 and to a voltage divider network comprising serially connected resistors 84 and 86. The base 88 of transistor 82 is connected across resistor 86 to ground 11. Capacitor 90 is also provided across resistor 86. Emitter 92 of transistor 82 is connected to collector 74 of transistor 72 and also through resistor 94 to ground 11. In accordance with the present invention, d.c. biasing is applied to what may be termed the d.c. input port of amplifier 77, i.e., base 112 of transistor 72, by an active base biasing circuit 95. Positive voltage source Vcc is connected to the collector 96 of a third transistor 98 and to a voltage divider network comprising serially connected resistors 100 and 102. The base 104 of transistor 98 is connected to the junction of resistors 100 and 102. A capacitor 106 is connected between base 104 and ground. The emitter 108 of transistor 98 is connected to the d.c. input port of amplifier 77, i.e., base 112 of transistor 72, and a resistor 109 and capacitor 110 are provided between base 112 and ground.

Resistors 94 and 109 serve to establish a minimum current in transistors 82 and 98 respectively.

The value of capacitor 110 is chosen such that it presents a low impedance at high frequencies, by-passing such signals to ground 11. Thus, transistor 72 is, with respect to the RF carrier signals from source 10, connected in a common base configuration.

However, capacitor 110 isolates D.C. signals from ground and, therefore, with respect to D.C. biasing, transistor 72 is connected in what is known as a common emitter configuration. Such an arrangement is advantageous in that it allows all transistors to be of similar (not complimentary as for the example of FIG. 2) type, and thus requires only one power supply Vcc. In accordance with the present invention, each of the active biasing circuits 78 and 95, respectively, serve to provide a substantially constant low, essentially resistive impedance, over a wide range of modulation frequencies, to the d.c. output port of amplifier 77, and to the d.c. input port 112 of amplifier 77, i.e., base of transistor 72, respectively. The output impedance of each of biasing circuits 78 and 95 are low with respect to the impedance measured from the output 79 and input 112 ports of amplifier 72 with respect to ground, looking toward transistor 72, and thus establishes linear operation of the amplifier for a broad band of modulation frequencies supplied by source 10.

In accordance with one aspect of the invention, the respective values of resistors 84 and 86 and capacitor 90, in the collector biasing circuit 78 and the resistors 100 and 102 and capacitor 106 are chosen in accordance with equation (1), in effect, extend the range of frequencies for which the gain $\beta$ of the respective transistors 82 and 98 is equal to the constant D.C. gain $\beta_o$. This is achieved by compensating for changes in $\beta$ at frequencies above the common emitter cut-off frequency $f_c$, as explained in conjunction with the description of FIG. 2.

The circuit shown in FIG. 3 has been implemented using npn RCA TA 8922 transistors for transistors 72, 82 and 98, for operation at a carrier frequency of 4 GHz and range of modulation frequencies from 0 to 100 MHz. Values used for resistors 84 and 86 and capacitor 90 and for resistors 100 and 102 and capacitor 106 were respectively 180Ω, 2KΩ, and 10pF and 2.8KΩ, 200Ω and 10pF.

The circuits depicted in FIGS. 2 and 3 may also be implemented using Field Effect Transistors (FET). For example, such an implementation of the circuit of FIG. 2 would be modified to utilize what is known in the art as a common gate FET amplifier for the RF amplifier 30 of FIG. 2; and what is commonly known as a FET source follower for biasing circuit 50 and biasing circuit 32, if desired. It should be noted that a shunt resistor would be provided between the source of the biasing FET and ground, to ensure proper polarity of current flow between the FETs. The maximum value allowable for the shunt resistor is equal to the ratio of the pinch-off voltage of the RF amplifier FET to the maximum current flowing through the RF amplifier. As known in the art, such maximum current occurs when the voltage between the FET's source and gate is zero. Capacitor 55 in FIG. 2 is not used according to the invention to provide for extending the frequency response of the FET as was done for transistor 58 of the bipolar transistor type, since, as known in the art, the output impedance of a FET is substantially independent of the input impedance.

Figure 4:
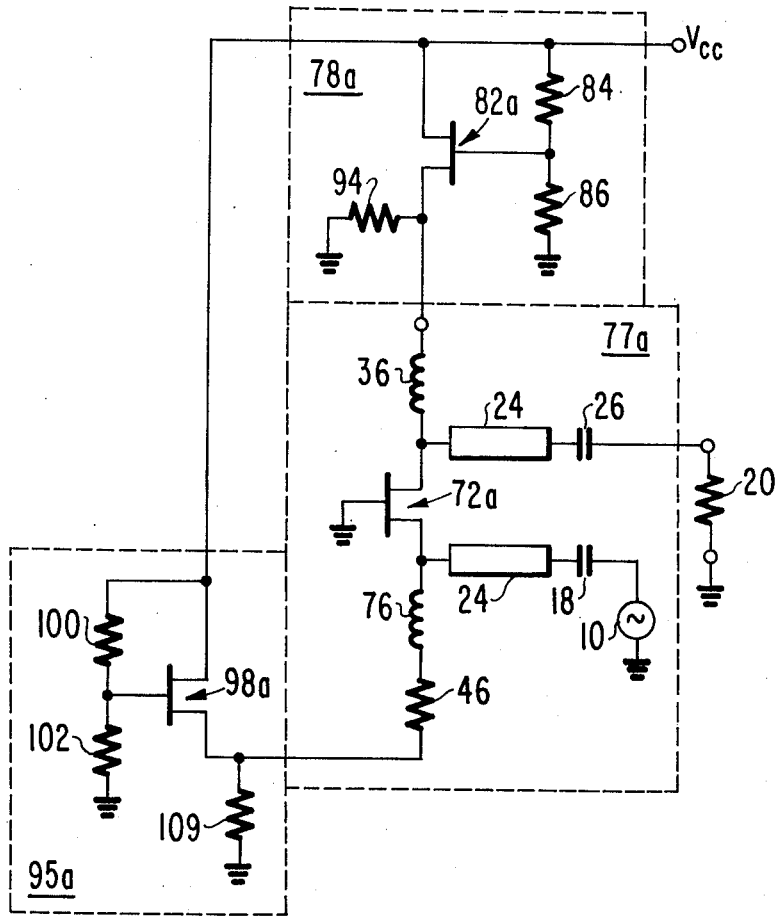
FIG. 4 is a schematic diagram of the preferred embodiment of a broadband class B amplifier in accordance with the present invention utilizing FET's.

Similar modification to FET's can be made to the circuit of FIG. 3. Such a modified circuit is depicted in FIG. 4. A common gate FET amplifier 72a is utilized for the RF amplifier (transistor 72). A first source follower 95a is utilized to provide a drain-source bias for FET RF amplifier 72a and a second source follower 78a is utilized to provide a bias voltage between the gate and source terminals of the FET RF amplifier, thus respectively providing the equivalent functions of collector biasing circuit 78 and base biasing circuit 95 in FIG. 3. The gate-source biasing voltage may be applied through resistor 46 and choke 76 to the source terminal of the FET RF amplifier and the gate connected directly to ground with respect to both RF and d.c. signals, thus eliminating capacitor 110, since the FET amplifier requires opposite bias polarity between gate and source, as compared to the base and emitter of a bipolar equivalent. It should be noted further that shunt resistor 109, is provided between the source of the source biasing FET 98a (equivalent of transistor 98 in FIG. 3) and ground, ensures proper polarity of current flow between the biasing and RF amplifier FETs.

With respect to the compensation capacitors 90 and 106 shown in FIG. 3 for use with bipolar transistors 82 and 98, respectively, such capacitors, may be eliminated in the FET circuit of FIG. 4 for the reasons explained above.

Experimental measurements have shown, that the circuit depicted in FIG. 3, implemented as described above with RCA TA 8922 transistors, operates with an efficiency in excess of ten percent for a carrier to intermodulation amplitude ratio of 30 db. As previously noted, a TWT amplifier operates at only about three percent efficiency at such carrier to intermodulation ratios. In general, it has been found that TWT amplifiers are presently more efficient than a class B linear amplifier in accordance with the present invention in situations where low carrier to intermodulation amplitude levels can be tolerated, e.g., in single carrier channel telecommunication systems. However, measurements have shown, that where high carrier to intermodulation amplitude ratios (20–30 db) must be maintained, as in telecommunication systems operating with multiple carrier frequencies within a single RF channel, a class B linear amplitude in accordance with the present invention operates with three to five times the efficiency of a TWT amplifier.

It should now be appreciated that the present invention provides a particularly advantageous linear class B or class AB amplifier by utilizing broad band active biasing circuits which present constant impedances to the RF amplifier transistor over a large spectrum of modulation frequencies.

What is claimed is:

1. A linear amplifier for amplifying a radio frequency (RF) signal, said RF signal being amplitude modulated by modulation signals having a wide range of frequencies, said amplifier being of the type having a D.C. input port and a d.c. output port and including a first transistor having first, second and third electrodes:

first biasing means connected across said input port for providing a first biasing voltage across said first and second electrodes, and second biasing means connected across said output port for providing a second biasing voltage across said first and third electrodes, linearization resistance means coupled to one of said first transistor electrodes for linearizing impedance components of said first transistor, the improvement comprising:
at least one of said biasing means being an active circuit, including a d.c. voltage source and at least one active element;
said one biasing means providing a substantially constant, essentially resistive, impedance over a substantial portion of said wide range of modulation frequencies at the associated port of said first transistor,
said impedance being low relative to the impedance of said amplifier as measured at said associated port with respect to ground looking towards said first transistor.

2. The linear amplifier of claim 1 wherein said active element is a second transistor having fourth, fifth and sixth electrodes and said active biasing means further comprises a voltage divider network having first and second resistors connected in series with a voltage source:
said fourth electrode being connected across said second resistor to ground;
said sixth electrode being connected across both said first and second resistors to ground; and
said fifth electrode providing said bias signal with respect to ground to the respective connected port of said first transistor.

3. The linear amplifier of claim 2 wherein said second transistor is a bipolar transistor and said active biasing means further includes:
a capacitor, connected across said second resistor to ground; and wherein the respective values of said first and second resistors and said capacitor are such that the time constant of said biasing circuit as measured between said fourth electrode and ground is substantially equal to the reciprocal of the product of $2\pi$ times the common emitter cutoff frequency of said second transistor.

4. The linear amplifier of claim 2 wherein:
said first and second transistors are bipolar transistors;
said first, second and third electrodes are respectively the base, the emitter and the collector of said first transistor; and
said fourth, fifth and sixth electrodes are respectively the base, the emitter and the collector of said second transistor.

5. The linear amplifier of claim 2 wherein said second transistor is a field effect transistor (FET).

6. The linear amlifier of claim 1 wherein said first transistor is a field effect transistor.

7. The linear amplifier of claim 1 wherein each of said first and second biasing means comprises active circuits, each including at least one active element;
each of said first, and second biasing means providing a substantially constant, essentially resistive, impedance at the respectively associated ports of said first transistor over a substantial portion of said wide range of modulation frequency;
said impedances of said first biasing means being low with respect to the impedance of said amplifier measured at said input port with respect to ground looking towards said first transistor;
said impedance of said second biasing means being low with respect to the impedance of said amplifier as measured at said output port with respect to ground looking towards said first transistor.

8. The linear amplifier of claim 7 wherein:
the active element of said first biasing means is a second transistor having fourth, fifth and sixth electrodes, said first biasing means further comprising a first voltage divider network having first and second resistors connected in series with a voltage source;
said fourth electrode being connected across said second resistor to ground;
said sixth electrode being connected across both said first and second resistors to ground; and
said fifth electrode with respect to ground providing said bias signal to the input port of said amplifier; and wherein
the active element of said second biasing means is a third transistor having seventh, eight and ninth electrodes and said second biasing means further includes a second voltage divider network comprising third and fourth resistors connected in series with said voltage source;
said seventh electrode being connected across said third resistor to ground;
said ninth electrode being connected across both said third and fourth resistors to ground; and
said eighth electrode providing said bias signal with respect to ground to the output port of said first transistor.

9. The linear amplifier of claim 8 wherein at least one of said transistors is a bipolar transistor.

10. The linear amplifier of claim 8 wherein at least one of said transistors is a field effect transistor (FET).

11. The linear amplifier of claim 9 wherein:
said first, second and third transistors are bipolar transistors;
said first, second and third electrodes are respectively the base, the emitter and the collector of said first transistor;
said fourth, fifth and sixth electrodes are respectively the base, the emitter and the collector of said second transistor; and
said seventh, eighth and ninth electrodes are respectively the base, the emitter and the collector of said third transistor.

12. The linear amplifier of claim 10 wherein:
said first, second and third transistors are FET's;
said first, second and third electrodes are respectively the gate, source and drain of said first transistor;
said fourth, fifth and sixth electrodes are respectively the gate, source and drain of said second transistor; and
said seventh, eighth and ninth electrodes are respectively the gate, source and drain of said third transistor.

* * * * *